United States Patent
Hwang (10) Patent No.: US 9,219,057 B2
(45) Date of Patent: Dec. 22, 2015

(54) ELECTROSTATIC DISCHARGE PROTECTION DEVICE AND METHOD FOR MANUFACTURING THE SAME

(75) Inventor: Kyong-Jin Hwang, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 482 days.

(21) Appl. No.: 12/504,173

(22) Filed: Jul. 16, 2009

(65) Prior Publication Data

US 2010/0133618 A1 Jun. 3, 2010

(30) Foreign Application Priority Data

Dec. 2, 2008 (KR) .................. 10-2008-0121177

(51) Int. Cl.
| | |
|---|---|
| H01L 27/02 | (2006.01) |
| H01L 29/08 | (2006.01) |
| H01L 29/66 | (2006.01) |
| H01L 29/78 | (2006.01) |
| H01L 29/06 | (2006.01) |
| H01L 29/10 | (2006.01) |
| H01L 29/417 | (2006.01) |
| H01L 29/45 | (2006.01) |

(52) U.S. Cl.
CPC ........ *H01L 27/0266* (2013.01); *H01L 29/0847* (2013.01); *H01L 29/66659* (2013.01); *H01L 29/7835* (2013.01); *H01L 29/0692* (2013.01); *H01L 29/1087* (2013.01); *H01L 29/41775* (2013.01); *H01L 29/456* (2013.01)

(58) Field of Classification Search
CPC .................................. H01L 24/0248
USPC ............................ 257/173, 355, 356, 546, 360
See application file for complete search history.

(56) References Cited

U.S. PATENT DOCUMENTS

| 5,493,142 A | * | 2/1996 | Randazzo et al. ............ 257/328 |
| 5,852,541 A | * | 12/1998 | Lin et al. ..................... 361/111 |
| 6,281,527 B1 | * | 8/2001 | Chen ............................ 257/168 |
| 6,750,527 B1 | * | 6/2004 | Momohara ................... 257/511 |
| 6,882,011 B1 | * | 4/2005 | Chen ............................ 257/355 |
| 7,119,405 B2 | * | 10/2006 | Chen et al. ................... 257/391 |
| 2004/0209432 A1 | * | 10/2004 | Ku et al. ..................... 438/301 |
| 2008/0142849 A1 | * | 6/2008 | Alvarez et al. ................ 257/213 |

FOREIGN PATENT DOCUMENTS

| KR | 10 2002 0017104 A | 3/2002 |
| KR | 10-2004-0081940 | 9/2004 |

* cited by examiner

*Primary Examiner* — Yu-Hsi D Sun
(74) *Attorney, Agent, or Firm* — Morgan, Lewis & Bockius LLP (57) ABSTRACT

An electrostatic discharge (ESD) protection device for protecting an internal circuitry from being damaged during electrostatic discharge, and a method for manufacturing the ESD protection circuit are provided. The electrostatic discharge (ESD) protection device includes: a gate electrode over a substrate; first and second doping regions provided in the substrate exposed at both sides of the gate electrode, the first and second doping regions having the same conductivity type; a third doping region provided in the second doping region and having an opposite conductivity type to that of the second doping region; and fourth and fifth doping regions spaced apart from the gate electrode and provided in the substrate exposed at both sides of the gate electrode, the fourth and fifth doping regions having the same conductivity type as the first and second doping regions.

31 Claims, 7 Drawing Sheets

ELECTROSTATIC DISCHARGE PROTECTION DEVICE AND METHOD FOR MANUFACTURING THE SAME

CROSS-REFERENCE TO RELATED APPLICATIONS

The present invention claims priority of Korean Patent Application No. 10-2008-0121177, filed on Dec. 2, 2008, which is incorporated herein by reference.

BACKGROUND OF THE INVENTION

1. Field of the Invention

The present invention relates to semiconductor manufacturing technology; and, more particularly, to an electrostatic discharge (ESD) protection device for protecting an internal circuitry from being damaged during electrostatic discharge, and a method for manufacturing the ESD protection circuit.

2. Description of Related Art

As well known in the art, when a semiconductor integrated circuit is brought to a contact with a human body or machine charged with static electricity, a transient current with high energy is generated while the static electricity charged in the human body or machine is discharged into an internal circuit through an external pin via a pad. The transient current with high energy may severely damage the internal circuitry.

On the contrary, when the static electricity charged in the semiconductor integrated circuit is discharged into the human body or machine due to the contact therebetween, the internal circuitry may also be damaged. To protect a main circuitry from being damaged due to the electrostatic discharge in most semiconductor integrated circuits, an electrostatic discharge (ESD) protection circuit is installed between a pad and a semiconductor internal circuit.

Designing of the ESD protection circuit is achieved by modifying only parameters during a layout design using a standard process. The performance of the ESD protection device is strongly correlated with its size. That is, the ESD protection device should have a predetermined size or greater to improve the performance. For this reason, the ESD protection device occupies a large area in a chip inevitably. Accordingly, a total chip size may depend on how compactly unit ESD protection devices are formed. However, there is a limitation to reduce the total chip size because the total occupation area of the ESD protection devices in the chip is 30% or greater.

SUMMARY OF THE INVENTION

An embodiment of the present invention is directed to an electrostatic discharge (ESD) protection device and a method for manufacturing the same, which can improve its operation characteristics and reduce its size to thereby reduce a semiconductor chip size as well.

In accordance with an aspect of the present invention, there is provided an electrostatic discharge (ESD) protection device, including: a gate electrode over a substrate; first and second doping regions provided in the substrate exposed at both sides of the gate electrode, the first and second doping regions having the same conductivity type; a third doping region provided in the second doping region and having an opposite conductivity type to that of the second doping region; and fourth and fifth doping regions spaced apart from the gate electrode and provided in the substrate exposed at both sides of the gate electrode, the fourth and fifth doping regions having the same conductivity type as the first and second doping regions.

In accordance with another aspect of the present invention, there is provided a method for manufacturing an ESD protection device, the method including: forming a gate electrode over a substrate; forming first and second doping regions in the substrate exposed at both sides of the gate electrode, the first and second doping regions having the same conductivity type; forming a third doping region in the second doping region, the third doping region having an opposite conductivity type to that of the second doping region; and forming fourth and fifth doping regions in the substrate exposed at both sides of the gate electrode, the fourth and fifth doping regions being spaced apart from the gate electrode and having the same conductivity type as the first and second doping regions.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

The advantages, features and aspects of the invention will become apparent from the following description of the embodiments with reference to the accompanying drawings, which is set forth hereinafter.

To begin with, descriptions will be made in consideration of improving the performance of an electrostatic discharge (ESD) protection device with reference to the accompanying drawings. Herein, it should be noted that the accompanying drawings are not given to explain the prior art but given to relatively compare preferred embodiments of the present invention.

In general, the ESD protection device employs a gate-grounded n-type channel metal oxide semiconductor (GGNMOS) in which a drain is connected to a pad, and a source and a gate are connected to a ground, or employ gate-powered p-type channel MOS (GPPMOS) in which a drain is connected to a pad, and a source and a gate are connected to a power supply.

Figure 1:
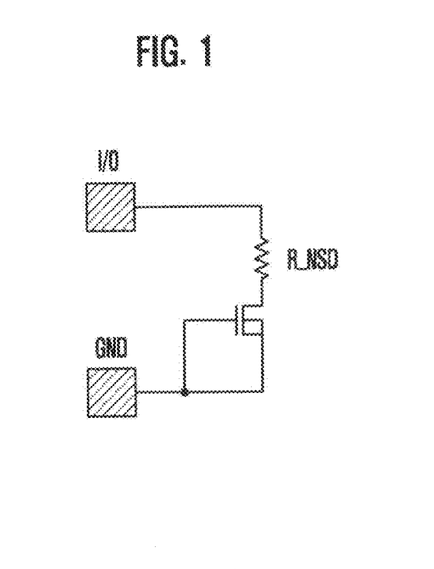
FIG. 1 is an equivalent circuit diagram of an electrostatic discharge (ESD) protection device having a gate-grounded n-type channel metal oxide semiconductor (GGNMOS) structure.
Figure 2:
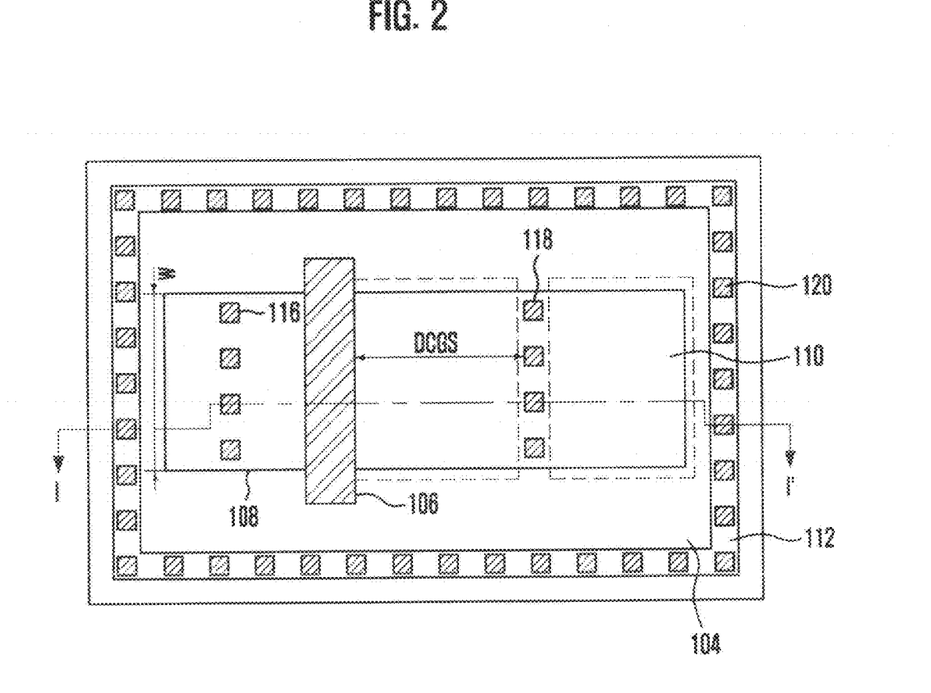
FIG. 2 is a plane view of the ESD protection device of FIG. 1.
Figure 3:
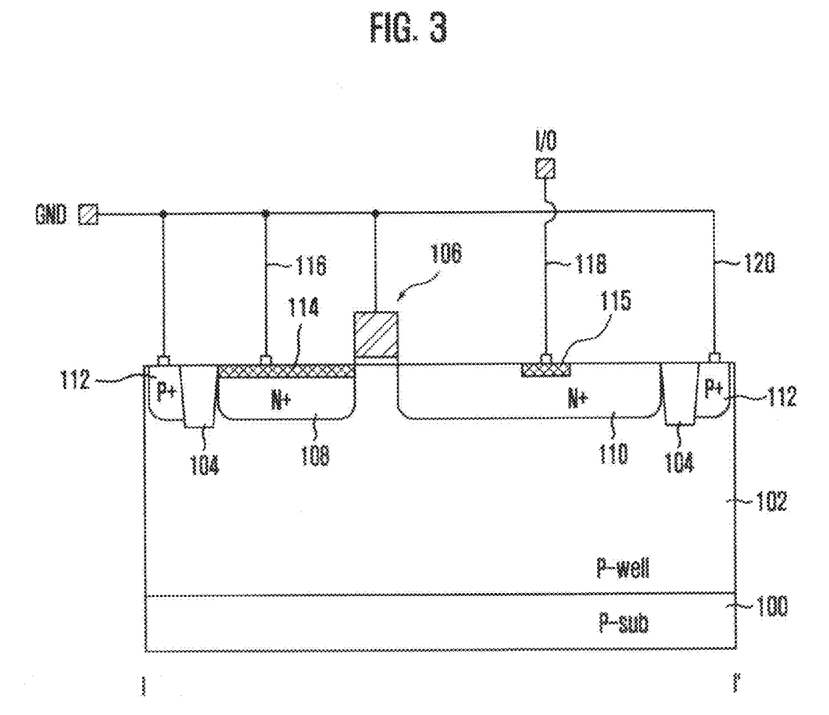
FIG. 3 is a cross-sectional view taken along line I-I'.

FIG. 1 is an equivalent circuit diagram of an ESD protection device having a GGNMOS structure. FIG. 2 is a plane view of the ESD protection device of FIG. 1. FIG. 3 is a cross-sectional view taken along line I-I'.

Referring to FIGS. 1 to 3, the ESD protection device includes a gate electrode 106, a source region 108, a drain region 110, and a pick-up region 112. The drain region 110 is provided in a well 102 of a substrate 100, and connected to an input/output (I/O) pad through a drain contact 115 and a drain connection line 118. The source region 108 is provided in the well 102, and connected to a ground terminal GND through a source contact 114 and a source connection line 116.

The gate electrode 106 and the source region 108 are connected to the ground terminal GND. The pick-up region 112 is provided to apply a bias voltage to the well 102, and connected to the ground terminal GND through a pick-up connection line 120. The pick-up region 112 is electrically isolated from the adjacent source and drain regions 108 and 110 by a device isolation structure 104.

Operation of the ESD protection device having the above-described structure will be described in detail below. For convenience in description, a GGNMOS device will be exemplarily illustrated in which the well 102 has a p-type, the gate electrode 106 has an n+ type, the source and drain regions 108 and 110 have n+ types, and the pick-up region 102 has a p+ type.

When a positive ESD is generated at the I/O pad, impact ionization occurs between the drain region 110 and the well 102 so that charges injected into the drain region 110 are still accumulated in the drain region 110 until charge avalanche. That is, when the positive ESD is generated at the I/O pad, a strong electric field is applied across a depletion region of the drain region 110, and thus electrons in the well 102 around the depletion region are injected to the drain region 110, accelerating the impact ionization.

If this leads to avalanche breakdown, a current starts flowing into the pick-up region 112 from the drain region 110 through the well 102 due to a hole current caused by the impact ionization. The hole current ultimately leads to an increase in electric potential of the well 102 so that a parasitic bipolar junction transistor (BJT) operates. Consequently, the GGNMOS device has the high-current performance of the BJT. This state is called "triggering state of the GGNMOS device. In this way, the operation of the GGNMOS device allows the static electricity introduced into the drain region 110 to be discharged into the ground terminal GND, thereby protecting internal devices.

The ESD protection device having the above structure will be described below in terms of reduction in a chip size.

Figure 4:
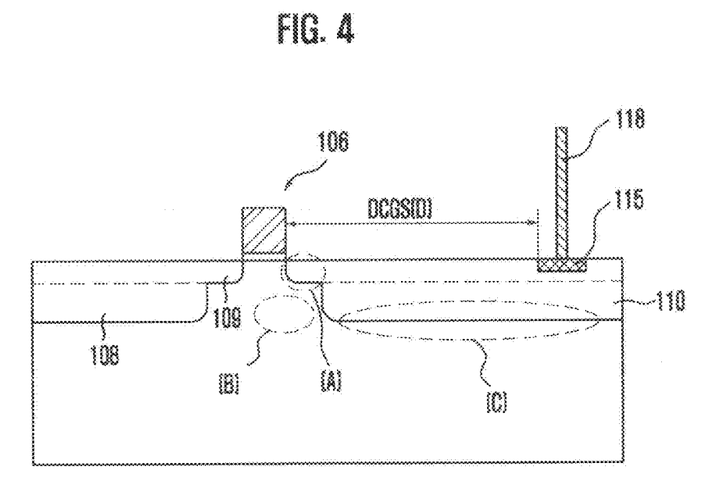
FIG. 4 is an enlarged cross-sectional view of a portion of the ESD protection device of FIG. 3.

FIG. 4 is an enlarged cross-sectional view of a portion of the ESD protection device of FIG. 3.

Referring to FIG. 4, in order for ESD stress not to be concentrated on a lightly doped drain (LDD) 109 as indicated by reference symbol A, a silicide layer is formed in a portion of the drain region 110, i.e., in the drain contact 115, so as to have constant resistance characteristic.

In addition, the ESD protection device should secure a drain contact to gate space (DCGS) D between the drain contact 115 and the gate electrode 106 to effectively protect the internal device. When the DCGS (D) between the drain contact 115 and the gate electrode 106 is smaller than a predetermined length, the ESD current tends to be concentrated around the LDD region 109 and a thermal breakdown easily occurs at the location B, resulting in the breakdown of the ESD device.

Therefore, the silicide layer should not be formed from a side portion of the drain contact 115 to the gate electrode 106 in order to uniformly disperse the ESD current over the drain region 110 as indicated by reference symbol C in FIG. 4. To this end, the silicide layer should have a length ranging from approximately 2 µm to approximately 5 µm.

For example, it is assumed that the GGNMOS device has the DCGS of 1 µm and 5 µm between the drain contact 115 and the gate electrode 106, respectively. In case where ten unit GGNMOS devices are connected to each other in parallel within a single chip, a total DCGS becomes '1 µm×10=10 µm' if the DCGS of the unit device is 1 µm. However, if the DCGS of the unit device is 5 µm, a total DCGS becomes '5 µm×10=50 µm', which increases a total chip size in comparison with the case the unit device has the DCGS of 1 µm.

As described above, the DCGS of the ESD protection device should be minimized to reduce a size of a chip including the ESD protection device. However, the decrease in DCGS may cause the performance of the ESD protection device to be degraded. Therefore, the preferred embodiment of the present invention suggests a method capable of preventing the degradation of the performance of the ESD protection device, which might occur due to the decrease in DCGS, by reducing a chip size through reducing the DCGS.

Hereinafter, a preferred embodiment of the present invention will be more fully described with reference to the accompanying drawings.

In the drawings, widths, thicknesses and spaces of layers (films, regions) are exaggerated for clarity and convenience in description. If numerical ranges are described in the specification, it should be understood that they have those ranges.

Furthermore, it shall be understood that when a layer is referred to as being 'on (over)' another layer or substrate herein, it may be directly on the other layer or substrate, and one or more intervening elements may also be present. Likewise, it shall be understood that when an element is referred to as being on 'one side' or 'both sides' of another element, it may be formed at a left side or a right side in a bilateral symmetric structure. Like reference numerals in the drawings denote like elements. If a layer is etched or polished, the etched or polished layer shall be indicated by the same reference numeral to which an alphabetic character is newly added.

Embodiment

Figure 5:
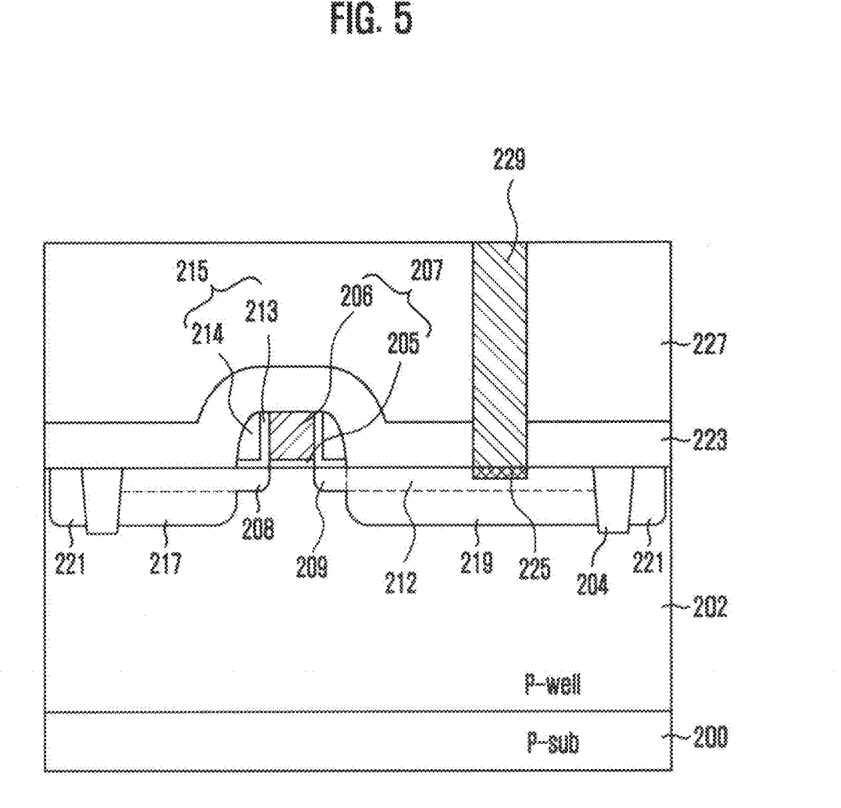
FIG. 5 is a cross-sectional view of an ESD protection device in accordance with an embodiment of the present invention.

FIG. 5 is a cross-sectional view of an ESD protection device in accordance with an embodiment of the present invention.

In the ESD protection device of FIG. 5, a drain region connected to an I/O pad and a source region connected to a ground terminal GND have an asymmetric structure.

Referring to FIG. 5, the drain region includes second, third and fifth doping regions 209, 212 and 219, and the source region includes first and fourth doping regions 208 and 217. The first and second doping regions 208 and 209 have the same conductivity type (e.g., p-type or n-type), and are symmetrically arranged with respect to a gate electrode 207.

Likewise, the fourth and fifth doping regions 217 and 219 have the same conductivity type, and are symmetrically arranged with respect to the gate electrode 207. The first and second doping regions 208 and 209 serving as LDD regions have lower impurity concentration than the fourth and fifth doping regions 217 and 219. For example, the first and second doping regions 208 and 209 may have n-type conductivity if a device has a GGNMOS structure, and may have p-type conductivity if a device has a GPPMOS structure.

To achieve a small DCGS by increasing the resistance of the drain region, the third doping region 212 is formed to have opposite conductivity to those of the first and second doping regions 208 and 209 through counter-doping process. In the drain region, the resistance increases at a region where the third doping region 212 is formed, thus reducing DCGS corresponding to a resistance increment. That is, the resistance of the drain region is controlled through the counter-doping process, not through DCGS.

The third doping region 212 may be spaced apart from a sidewall of the gate electrode 207 by at least approximately 0.2 μm, specifically, approximately 0.2 μm to approximately 0.5 μm. When the third doping region 212 is not spaced apart from the sidewall of the gate electrode 207 by 0.2 μm, the second doping region 209 of the LDD region may not be formed because it is offset by the third doping region 212. That is, when the third doping region 212 is formed using the same ion implantation mask for the second doping region 209, the third doping region 212 is formed over the entire second doping region 209. This provides the same result as if the second doping region 209 does not exist.

The second doping region 209 of the LDD region is a critical factor determining a triggering voltage of the ESD protection device. Accordingly, the LDD region is one of elements required in the ESD protection device. For instance, a low-voltage triggering may occur in the LDD region of a nano-sized device having a thin gate dielectric. This is because the nano-sized device has a shallow junction region and thus has a heavily doped halo region to prevent a punch through and resistance increase in the LDD region.

It is no wonder that the triggering voltage is lowered at a heavily doped junction, and a breakdown voltage of the thin gate dielectric upon stress is low. Therefore, it is important to perform BJT operation at a low voltage. Although the doping region may be formed to have the same profile as the LDD region in the technique where a gate length is 0.25 μm or more, the profile may vary depending on technique and device structure.

The source and drain regions are provided in a first well 202. A second well (not shown) may be further provided in the first well 202. The second well has the same conductivity as the first well 202, and is heavily doped like the first well 202. For example, the second well has p-type conductivity in a GGNMOS device, and has n-type conductivity in a GPPMOS device. The second well is disposed under the fifth doping region 219 of the drain region.

Devices having various operation voltages may be implemented on a wafer. For example, devices having operation voltages of 2.5V, 5 V, etc., are often formed on a single wafer at the same time. The devices necessitate different wells because of different operation voltages, thus requiring various masks. In addition, such wells should be formed at different positions, respectively. However, several wells may overlap each other in the vicinity of the drain region in the ESD protection device. This does not affect device characteristics because the ESD protection device is turned off during normal operation but only turned on when an ESD stress is applied.

Accordingly, in accordance with the embodiment of the present invention, the second well for another operation voltage device is formed under the drain region of the ESD protection device so that well concentration locally increases. In other words, the second well overlaps the first well to increase the well concentration locally at the overlapping region of the first and second wells. This induces an avalanche breakdown voltage under the drain region when the ESD stress is applied, allowing the ESD stress, i.e., a path of an ESD current, to be dispersed to a bottom and a periphery of the drain region.

Herebelow, a method for manufacturing an ESD protection device in accordance with an embodiment of the present invention will be described.

FIGS. 6A to 6G are cross-sectional views illustrating a method for manufacturing an ESD protection device in accordance with an embodiment of the present invention.

Figure 6A:
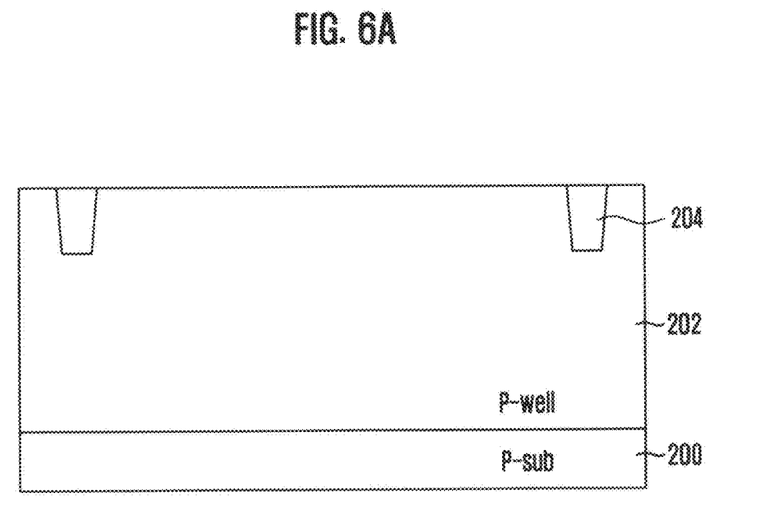
FIGS. 6A to 6G are cross-sectional views illustrating a method for manufacturing an ESD protection device in accordance with an embodiment of the present invention.

Referring to FIG. 6A, a substrate 200 is prepared. The substrate 200 includes a semiconductor substrate formed of one material selected from the group consisting of silicon (Si), germanium (Ge), silicon germanium (SiGe), gallium phosphide (GaP), gallium arsenide (GaAs), silicon carbide (SiC), silicon-germanium-carbon (SiGeC), indium arsenide (InAs) and indium phosphide (InP). The substrate 200 may have p-type or n-type conductivity.

Impurity ions are implanted onto the substrate 200 to form a first well 202. The first well 202 has p-type conductivity in a GGNMOS device, and n-type conductivity in a GPPMOS device.

Although not shown, a second well may be formed in the first well 202. Resultantly, an overlapping region of the first well 202 and the second well has a higher doping concentration than the other regions. The second well may be formed under a fifth doping region (see 219 in FIG. 6E). The second well has the same conductivity as the first well 202, and is used for another device.

A device isolation structure 204 is formed in the substrate 200. The device isolation structure 204 is formed through local oxidation of silicon (LOCOS) process or shallow trench isolation (STI) process. Preferably, the device isolation structure 204 is formed through the STI process because the STI process is advantageous to high integration. The device isolation structure 204 is formed of insulating material, preferably, oxide. More preferably, the device isolation structure 204 may be formed of a high density plasma (HDP) layer having a good gap-fill property that is applicable to a multi-layered structure with a high aspect ratio.

Figure 6B:
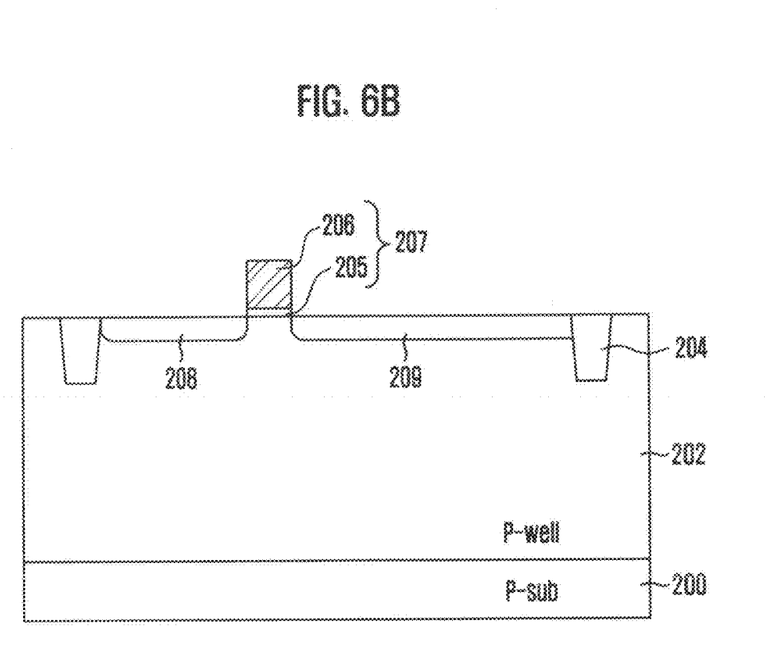

Referring to FIG. 6B, a gate electrode 207 is formed on the substrate 200. The gate electrode 207 may have a multilayered structure of a gate dielectric 205 and a gate conductive layer 206. For instance, the gate dielectric 205 includes a silicon oxide layer, and the gate conductive layer 206 includes a polysilicon layer and a metal silicide layer (or metal nitride layer).

The first and second doping regions 208 and 209, which serve as an LDD region, are formed in the substrate 200 exposed at both sidewalls of the gate electrode 207. The first and second doping regions 208 and 209 have the same conductivity, and are formed to a depth ranging from approximately 1,000 Å to approximately 2,000 Å from the top surface of the substrate 200.

Figure 6C:
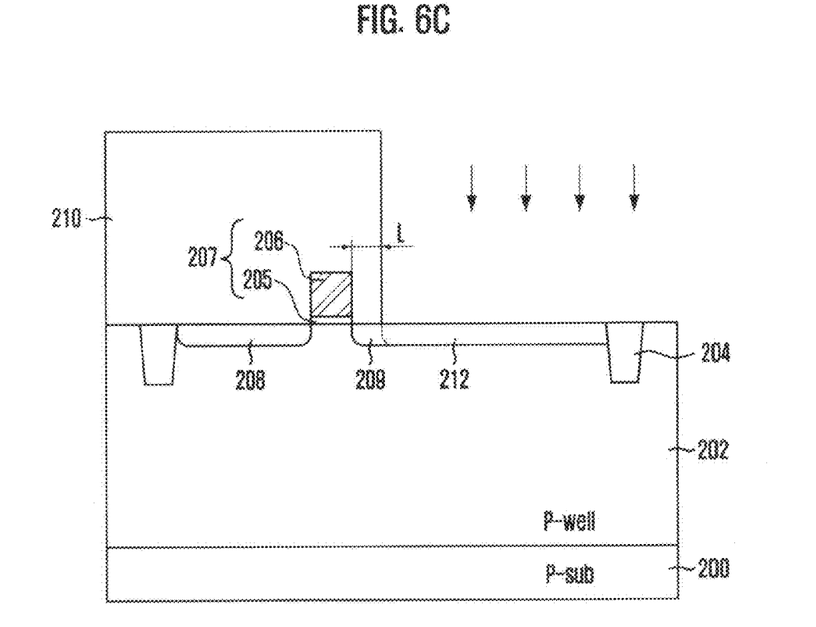

Referring to FIG. 6C, a photoresist pattern 210 having an opening corresponding to a portion of the second doping region 209 is formed.

An ion implantation process is performed using the photoresist pattern 210 as an ion implantation mask to form a third doping region 212 in the second doping region 209. The third doping region 212 is spaced apart from a sidewall of the gate electrode 207. Preferably, the third doping region 212 is spaced apart from a sidewall of the gate electrode 207 by a distance (L) ranging from approximately 0.2 μm to approximately 0.5 μm. The ion implantation process, which is a counter-doping process, is performed at a dose of approximately $1 \times 10^{14}$ atoms/cm$^2$ to approximately $2 \times 10^{15}$ atoms/cm$^2$ using dopant having an opposite conductivity to that of the second doping region 209.

Figure 6D:
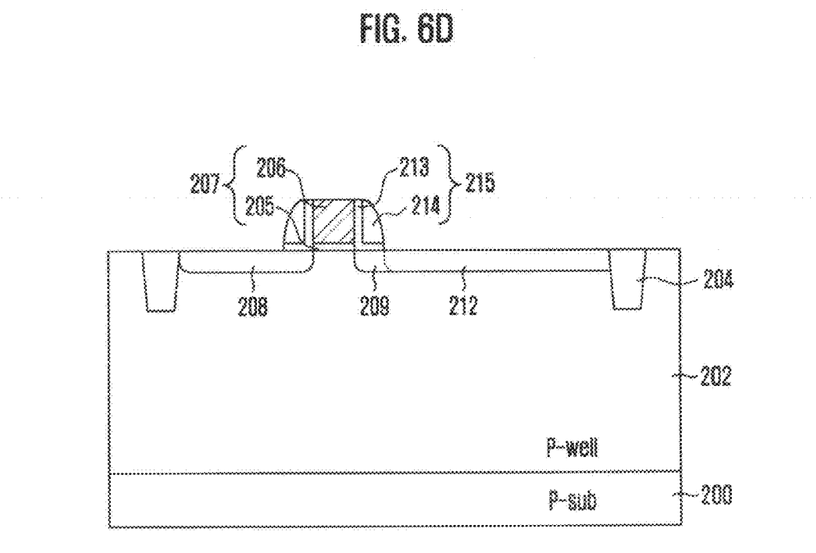

Referring to FIG. 6D, the photoresist pattern 210 (see 210 in FIG. 6C) is removed. After the counter-doping process, a thermal treatment may be further performed to recover a damage of the substrate 200 due to the implantation of a great amount of dopant. The thermal treatment may be performed using a rapid thermal process or a furnace thermal process. The furnace thermal process may be performed in a nitrogen gas ambient at a temperature ranging from approximately 500° C. to approximately 600° C. for approximately 2 hours to approximately 8 hours.

A spacer 215 is formed at both sidewalls of the gate electrode 207. The spacer 215 has a multilayered structure of an oxide layer 213 and a nitride layer 214. In the multilayered structure, the oxide layer 213 may be formed over the nitride layer 214, or the nitride layer 214 may be formed over the oxide layer 213. One side of the spacer 215 may be aligned with one side of the third doping region 212.

Figure 6E:
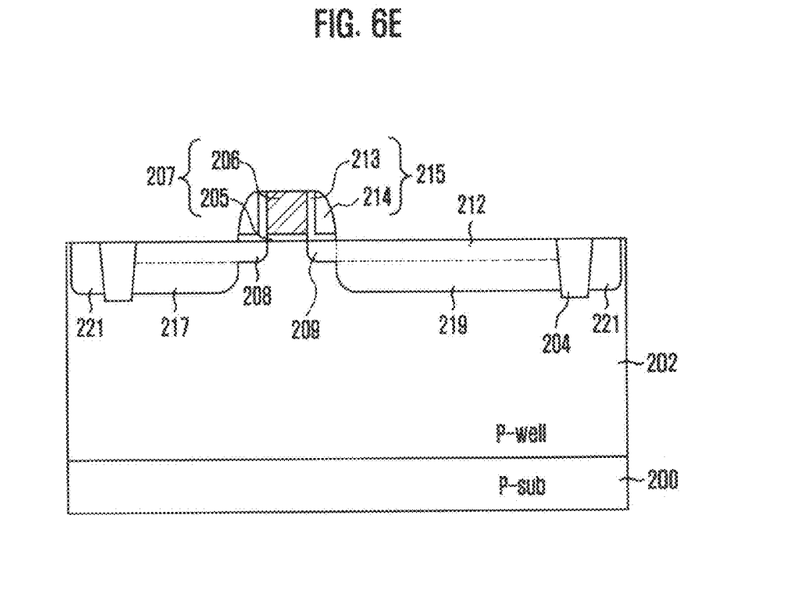

Referring to FIG. 6E, an ion implantation process is performed to form fourth and fifth doping regions 217 and 219 in the substrate 200 exposed at both sidewalls of the spacer 215 including the gate electrode 207. The fourth and fifth doping regions 217 and 219 may be formed at a doping concentration that is several tens to several hundreds of times the doping concentrations of the first and second doping regions 208 and 209. For example, the fourth and fifth doping regions 217 and 219 are formed at a dose of approximately $1 \times 10^{15}$ atoms/cm$^2$ to approximately $2 \times 10^{16}$ atoms/cm$^2$ using dopant having the same conductivity to that of the first and second doping regions 208 and 209.

A pick-up region 221 is formed in the first well 202. The pick-up region 221 has an opposite conductivity to that of those of the fourth and fifth doping regions 217 and 219. The pick-up region 221 is electrically isolated from the adjacent fourth and fifth doping regions 217 and 219 by virtue of the device isolation structure 204.

Figure 6F:
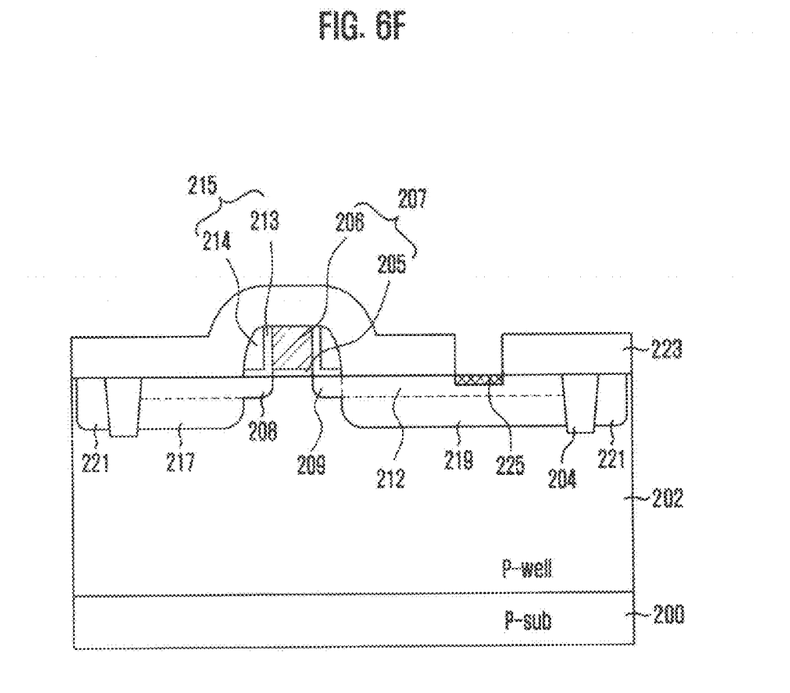

Referring to FIG. 6F, a silicide blocking layer 223 is formed along a surface profile of a resultant structure so as to expose a portion of the third doping region 212. The silicide blocking layer 223 is formed of an insulating material, for example, oxide or nitride. More specifically, the silicide blocking layer 223 is formed of phosphosilicate glass (PSG), tetra ethyle ortho silicate (TEOS), or borophosphosilicate glass (BPSG).

A contact 225 is formed in the third doping region 212 that is not covered with the silicide blocking layer 223. The contact 225 is formed such that it is separated from the sidewall of the gate electrode 207 by a distance ranging from approximately 0.3 µm to approximately 5 µm. The contact 225 is formed of metal silicide. For instance, the contact 225 is formed of cobalt silicide or titanium silicide.

Figure 6G:
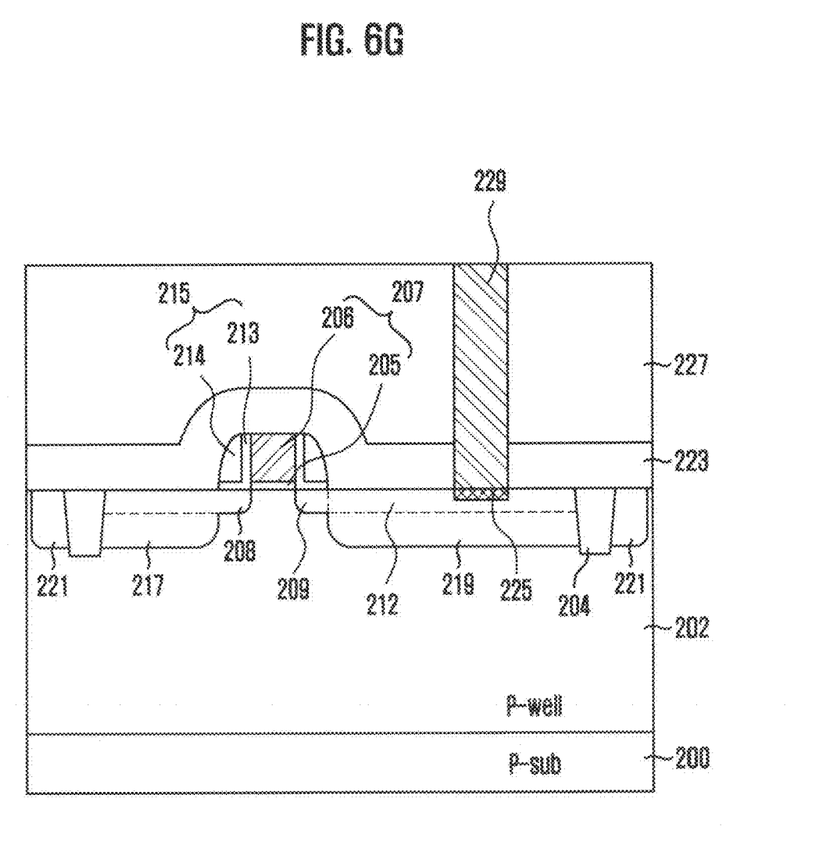

Referring to FIG. 6G, an internal layer dielectric (ILD) 227 is formed so as to cover the substrate 200 including the contact 225 and the silicide blocking layer 223, and then etched to form a contact hole (not shown) exposing the contact 225. The ILD 227 is formed of oxide.

A contact plug 229 is formed to fill the contact hole. The contact plug 229 is connected to an interconnection (not shown) through a follow-up process. The interconnection is connected to an I/O pad. Of course, although not shown, the interconnection process may be simultaneously performed with a process of forming the contact plug for connecting the first doping region 208 to the ground terminal and the gate electrode 207.

In accordance with the present invention, a counter-doping process is performed on a drain region of an ESD protection device to thereby increase the resistance of the drain region, which makes it possible to improve the performance of the ESD protection device and reduce DCGS corresponding to a resistance increment.

Furthermore, in accordance with the present invention, a well is additionally formed or a well for another device is formed under the drain region to increase well concentration. Therefore, a triggering voltage is reduced when an ESD stress is applied, thereby realizing a device endurable against an ESD current.

As described above, although the technical idea of the present invention is specifically described in the preferred embodiments, it is noted that such description is illustratively explained, not limiting the present invention. In particular, the embodiments of the present invention employ GGNMOS or GPPMOS devices, the present invention may also be applicable to all the semiconductor devices such as silicon controlled rectifier (SCR). In addition, the adjustment of resistance of each type SCR makes it possible to control a holding voltage and a triggering voltage. Like this, it will be apparent to those skilled in the art that various changes and modifications may be made without departing from the spirit and scope of the invention as defined in the following claims.

What is claimed is:

1. An electrostatic discharge (ESD) protection device, comprising:
   a substrate with a top surface;
   a gate electrode over the substrate;
   a drain region disposed adjacent to the gate electrode;
   a source region disposed adjacent to the gate electrode;
   first and second doping regions formed in the substrate exposed at both sides of the gate electrode, the first and second doping regions having the same conductivity type and being aligned with sidewalls of the gate electrode;
   a third doping region formed in the second doping region and doped with an opposite conductivity type to that of the second doping region;
   fourth and fifth doping regions spaced apart from the gate electrode and provided in the substrate exposed at both sides of the gate electrode, the fourth and fifth doping regions having the same conductivity type as the first and second doping regions;
   a silicide blocking layer in direct contact with the gate electrode,
   wherein the second doping region and the fifth doping region are disposed in the drain region,
   wherein the first doping region and the fourth doping region are disposed in the source region,
   wherein the third doping region is disposed in the drain region and the third doping region is not disposed in the source region such that the drain region is asymmetric with respect to the source region,
   wherein the second doping region has a first depth with reference to the top surface and an entire region of the third doping region has a second depth with reference to the top surface which is substantially the same as the first depth, and
   wherein the third doping region is in direct contact with the fifth doping region.

2. The ESD protection device of claim 1, wherein the third doping region is spaced apart from a sidewall of the gate electrode.

3. The ESD protection device of claim 2, wherein the third doping region is spaced apart from the sidewall of the gate electrode by a distance ranging from approximately 0.2 µm to approximately 0.5 µm.

4. The ESD protection device of claim 2, wherein the third doping region is formed to a thickness ranging from approximately 1,000 Å to approximately 2,000 Å.

5. The ESD protection device of claim 1, further comprising a contact plug disposed over the drain region.

6. The ESD protection device of claim 5, wherein the contact plug is disposed through the silicide blocking layer.

7. The ESD protection device of claim 5, wherein a distance between the contact plug and the gate electrode ranges from approximately 0.3 μm to approximately 5 μm.

8. The ESD protection device of claim 5, wherein the contact plug is connected to an input/output pad.

9. The ESD protection device of claim 8, wherein the first doping region is connected to a ground terminal, and the gate electrode is connected to the ground terminal.

10. The ESD protection device of claim 8, wherein the fifth doping region is located beneath the third doping region.

11. The ESD protection device of claim 1, further comprising a first well provided in the substrate to surround the first to fifth doping regions.

12. The ESD protection device of claim 11, further comprising a second well provided in the first well, and disposed under the fifth doping region, wherein the second well has a doping concentration higher than the first well.

13. The ESD protection device of claim 12, wherein the first and second wells have the same conductivity type.

14. The ESD protection device of claim 1, further comprising a spacer disposed on the sidewalls of the gate electrode.

15. The ESD protection device of claim 14, wherein the fourth and fifth doping regions are provided in the substrate and aligned with the spacer.

16. The ESD protection device of claim 14, wherein the silicide blocking layer is formed over the gate electrode and the spacer.

17. The ESD protection device of claim 1, wherein the third doping region is laterally spaced apart from the gate electrode.

18. The ESD protection device of claim 1, wherein the third doping region is exposed on the top surface of the substrate.

19. The ESD protection device of claim 1, wherein the first and second doping regions have lower impurity concentrations than the fourth and fifth doping regions.

20. The ESD protection device of claim 1, wherein a horizontal length of the first doping region in the source region is shorter than sum of horizontal length of the second doping region and the third doping region in the drain region.

21. The ESD protection device of claim 1, wherein the third doping region has a depth more shallow than the fifth region.

22. An electrostatic discharge (ESD) protection device, comprising:
    a substrate with a top surface;
    a gate electrode over the substrate;
    a source region disposed at one side of the gate electrode;
    a drain region disposed at the other side of the gate electrode and comprising a low doping region, a high doping region, and a counter-doping region, the low doping region and the high doping region having the same conductivity type, the counter-doping region having an opposite conductivity type to that of the high doping region; and
    a silicide blocking layer remaining at the source region or the drain region,
    wherein the low doping region is aligned with a sidewall of the gate electrode,
    wherein the counter-doping region is disposed in the drain region and the counter-doping region is not disposed in the source region such that the drain region is asymmetric with respect to the source region,
    wherein the low doping region has a first depth with reference to the top surface and an entire region of the counter doping region has a second depth with reference to the top surface which is substantially the same as the first depth, and
    wherein the counter doping region is in direct contact with the high doping region.

23. The ESD protection device of claim 22, further comprising a first well provided in the substrate to surround the drain region and the source region.

24. The ESD protection device of claim 23, further comprising:
    a second well provided in the first well and disposed under the high doping region,
    wherein the second well has a doping concentration higher than that of the first well.

25. The ESD protection device of claim 22, further comprising a spacer disposed on the sidewall of the gate electrode.

26. The ESD protection device of claim 25, wherein the counter-doping region is formed to align with the spacer.

27. The ESD protection device of claim 25, wherein the silicide blocking layer is formed over the gate electrode and the spacer.

28. The ESD protection device of claim 22, wherein the counter-doping region is laterally spaced apart from the gate electrode.

29. The ESD protection device of claim 22, wherein the counter-doping region is exposed on the top surface of the substrate.

30. The ESD protection device of claim 22, wherein the silicide blocking layer is in direct contact with the gate electrode.

31. The ESD protection device of claim 22, wherein the counter-doping region has a depth more shallow than the high doping region.

* * * * *